(12) United States Patent
Sun et al.

(10) Patent No.: US 6,379,977 B1
(45) Date of Patent: Apr. 30, 2002

(54) METHOD OF MANUFACTURING FERROELECTRIC MEMORY DEVICE

(75) Inventors: Ho Jung Sun; Soon Yong Kweon; Seung Jin Yeom, all of Kyoungki-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/405,809

(22) Filed: Sep. 24, 1999

(30) Foreign Application Priority Data

Oct. 1, 1998 (KR) .............................. 98-41365

(51) Int. Cl.[7] .................. H01L 21/20; H01L 21/00; H01L 21/8242
(52) U.S. Cl. .................. 438/3; 438/396; 438/240
(58) Field of Search .................. 438/396, 240, 438/381, 3, 239

(56) References Cited

U.S. PATENT DOCUMENTS

| | | | |
|---|---|---|---|
| 5,340,607 A | 8/1994 | Friz et al. | 427/162 |
| 5,431,958 A | 7/1995 | Desu et al. | 427/255.3 |
| 5,554,564 A | 9/1996 | Nishioka et al. | 437/192 |
| 5,554,866 A | 9/1996 | Nishioka et al. | 257/295 |
| 5,589,284 A | 12/1996 | Summerfelt et al. | 428/697 |
| 5,626,906 A | 5/1997 | Summerfelt et al. | 427/126.3 |
| 5,683,614 A | 11/1997 | Boyle | 252/62.9 R |
| 5,742,076 A | 4/1998 | Sridevan et al. | 257/77 |
| 5,750,419 A * | 5/1998 | Zafar | 438/3 |
| 5,850,089 A | 12/1998 | Varshney et al. | 257/295 |
| 5,851,896 A * | 12/1998 | Summerfelt | 438/396 |
| 5,858,851 A * | 1/1999 | Yamagata et al. | 438/396 |
| 5,882,946 A * | 3/1999 | Otani | 437/60 |
| 5,912,044 A * | 6/1999 | Farooq et al. | 427/79 |
| 6,004,857 A * | 12/1999 | Hsiao et al. | 438/396 |
| 6,010,940 A * | 1/2000 | Lee et al. | 438/396 |
| 6,022,774 A * | 2/2000 | Kawai et al. | 438/240 |

FOREIGN PATENT DOCUMENTS

| | | | |
|---|---|---|---|
| EP | 0448151 | 9/1991 | |
| EP | 0720213 | 3/1996 | |
| JP | 03019372 | 1/1991 | H01L/29/788 |
| JP | 08340084 | 12/1996 | |
| JP | 9153597 | 6/1997 | H01L/27/108 |
| JP | 10012844 | 1/1998 | H01L/27/108 |
| WO | 9634407 | 10/1996 | |
| WO | 9641375 | 12/1996 | |
| WO | 9735339 | 9/1997 | |

* cited by examiner

Primary Examiner—Olik Chaudhuri
Assistant Examiner—Shrinivas H. Rao
(74) Attorney, Agent, or Firm—Ladas & Parry

(57) ABSTRACT

A method of manufacturing a ferroelectric memory device which can improve the adhesion between an intermediate insulating layer and a lower electrode and the surface roughness of the lower electrode, is disclosed.

According to the present invention, a titanium layer and a first platinum layer are sequentially formed on a semiconductor substrate on which a first intermediate insulating layer is formed. The substrate is then thermal-treated under oxygen atmosphere to transform the titanium layer and the first platinum layer into a titanium oxide layer containing platinum. Next, a second platinum layer for a lower electrode, a ferroelectric thin film and a third platinum layer for an upper electrode are formed on the titanium oxide layer containing platinum, in sequence. The third platinum layer is then etched to form the upper electrode and the ferroelectric thin film, the second platinum layer and the titanium oxide layer containing platinum are etched to form a capacitor.

13 Claims, 6 Drawing Sheets

METHOD OF MANUFACTURING FERROELECTRIC MEMORY DEVICE

BACKGROUND OF THE INVENTION

1. Field of the Invention

The present invention relates to a method of manufacturing a semiconductor memory device, and more particularly to a method of manufacturing a ferroelectric memory device using a ferroelectric thin film as a dielectric layer of a capacitor.

2. Description of the Related Art

In general, in a ferroelectric memory device of nonvolatile memory devices, a ferroelectric thin film such as a $SrBi_2Ta_2O_9$(SBT) layer and a $Pb(ZrTi_{1-x})O_3$ layer is mainly used as a dielectric layer of a capacitor. The properties of the ferroelectric thin film depend on materials for upper and lower electrodes of the capacitor, especially the lower electrode material. Accordingly, to obtain good properties of the ferroelectric thin film, the lower electrode is formed of a platinum(Pt) layer having a good oxidation resistance, a conductive oxide layer such as an $IrO_2$ layer or a $RuO_2$ layer, or a metal layer such as an iridium(Ir) or ruthenium(Ru). Of these, the Pt layer is mainly used.

In the ferroelectric memory device as described above, the capacitor is generally formed by forming the lower electrode, the ferroelectric thin film and the upper electrode on an intermediate insulating layer such as an oxide layer. Here, the lower electrode is formed of the Pt layer. Furthermore, since the adhesion between the Pt layer and oxide layer is poor, a titanium(Ti) layer is interposed therebetween as a glue layer, for improving the adhesion.

However, when performing thermal processes under oxygen atmosphere subsequently after forming the Pt layer as the lower electrode, Ti is diffused into the Pt layer, thereby deteriorating the adhesion between the Ti layer and the intermediate insulating layer. Furthermore, Ti is oxidized in the Pt layer to form a titanium oxide layer. Therefore, the volume of the Pt layer is expanded so that the surface roughness of the lower layer is deteriorated, thereby deteriorating the reliability and the yield of device.

SUMMARY OF THE INVENTION

It is therefore an object of the present invention to a method of manufacturing a ferroelectric memory device which can improve the adhesion between an intermediate insulating layer and a lower electrode and the surface roughness of the lower electrode, for solving the problems in the conventional art.

To accomplish this above object, according to a first embodiment of the present invention, a titanium layer and a first platinum layer are sequentially formed on a semiconductor substrate on which a first intermediate insulating layer is formed. The substrate is then thermal-treated under oxygen atmosphere to transform the titanium layer and the first platinum layer into a titanium oxide layer containing platinum. Next, a second platinum layer for a lower electrode, a ferroelectric thin film and a third platinum layer for an upper electrode are formed on the titanium oxide layer containing platinum, in sequence. The third platinum layer is then etched to form the upper electrode. Next, the ferroelectric thin film, the second platinum layer and the titanium oxide layer containing platinum are etched to form a capacitor.

In the first embodiment, the total thickness of the titanium and the first platinum layers is 100 to 300 Å. The first platinum layer has a quarter thickness of the titanium layer to a thickness as the titanium layer. Furthermore, the thermal-treating is performed at the temperature 650 to 800° C. for 1 minute by rapid thermal process.

According to a second embodiment of the present invention, a titanium layer and a first platinum layer are sequentially formed on a semiconductor substrate on which a first intermediate insulating layer is formed. The substrate is then thermal-treated under the atmosphere of $N_2$ gas or inert gas by a first thermal process to react the titanium layer with the first platinum layer, thereby forming a platinum titanium ($Pt_xTi_y$) alloy layer. Next, the substrate is thermal-treated under oxygen atmosphere by a second thermal process, to prevent titanium not reacted during the first thermal process from diffusing. A ferroelectric thin film is then formed on the platinum titanium alloy layer. The ferroelectric thin film and the platinum titanium alloy layer are then etched to form a ferroelectric thin film pattern and a lower electrode. Thereafter, a capping layer is formed on the overall substrate so as to expose the ferroelectric thin film pattern. An upper electrode is then formed on the exposed ferroelectric thin film pattern, thereby forming the capacitor.

In the second embodiment, the first platinum layer is formed by in-situ after forming the titanium layer. The titanium layer is formed to the thickness of 50 to 500 Å and the first platinum layer is formed to the thickness of 1,000 to 3,000 Å. Furthermore, the first thermal process is performed at the temperature of 400 to 600° C. for 10 minutes to 2 hours by furnace and the second thermal process is performed at the temperature of 600 to 800° C. for 10 minutes to 2 hours. Moreover, the capping layer is formed of a silicon oxide layer.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, preferred embodiment of the present invention will be explained with reference to accompanying drawings.

FIG. 1A to FIG. 1G are cross sectional views describing a method of manufacturing a ferroelectric memory device according to a first embodiment of the present invention.

Figure 1A:
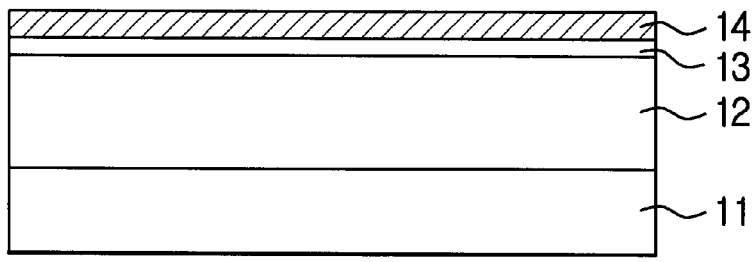
FIG. 1A to FIG. 1H are cross sectional views describing a method of manufacturing a ferroelectric memory device according to a first embodiment of the present invention.
Figure 1B:
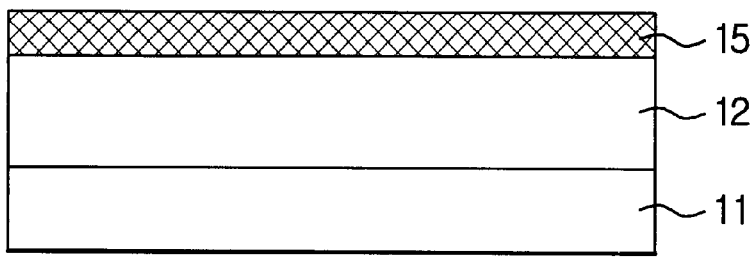

Referring to FIG. 1A, a titanium(Ti) layer 13 as a glue layer is formed on a semiconductor substrate 11 on which an intermediate insulating layer 12 is formed. Preferably, the Ti layer 13 is formed by sputtering. Furthermore, the intermediate insulating layer is formed of an oxide layer. A first platinum (Pt) layer 14 is then formed on the intermediate insulating layer 12. Preferably, the Ti and first Pt layers 13 and 14 are formed so that their total thickness is 100 to 300 Å. More preferably, the first Pt layer 14 has a quarter thickness of the Ti layer to a thickness as the Ti layer. Thereafter, a thermal process is performed at the temperature of 650 to 800° C. for 1 minute under oxygen atmosphere by rapid thermal process(RTP), so that the Ti layer 13 is oxidized and Pt and Ti are inter-diffused between the Ti and the first Pt layers, thereby forming a titanium oxide layer containing Pt 15, as shown in FIG. 1B.

Figure 1C:
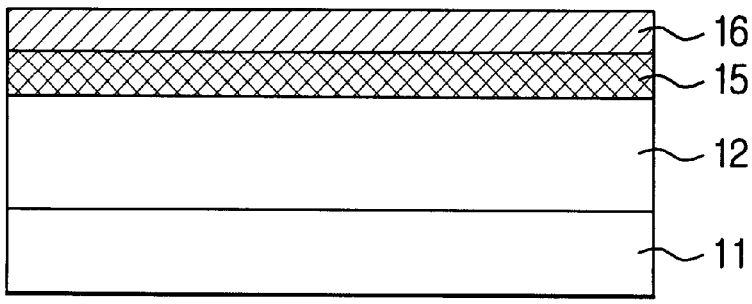

Referring to FIG. 1C, a second Pt layer 16 as a lower electrode material is formed on the titanium oxide layer containing Pt 15 to the thickness of 1,000 to 3,000 Å. To crystallize the second Pt layer 16, a thermal process is performed at the temperature 650 to 800° C. for 30 minutes under oxygen atmosphere by furnace. At this time, Ti is prevented from diffusing into the second Pt layer 16, since the thermal process to the second Pt layer 15 is performed after transforming the Ti layer 13 into the titanium oxide containing Pt 15.

Figure 1D:
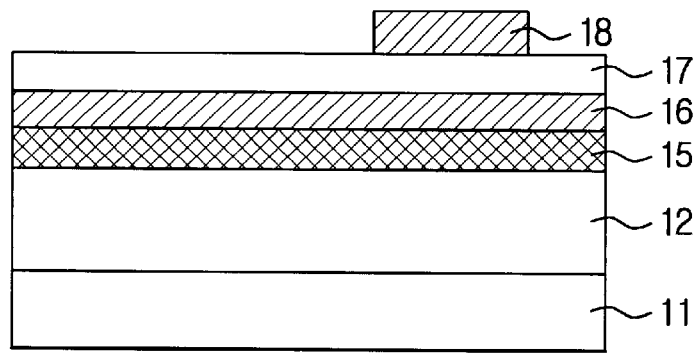
Figure 1E:
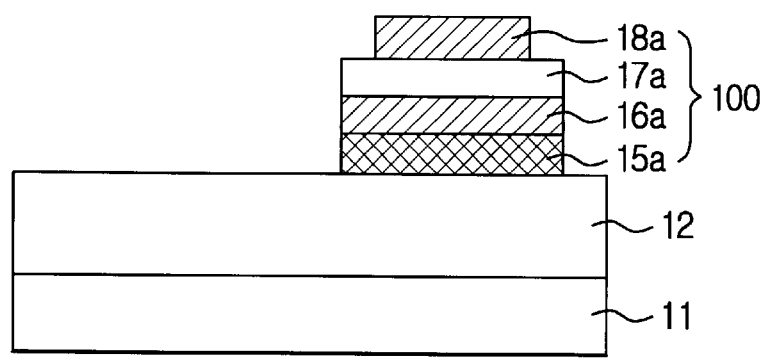

Referring to FIG. 1D, a ferroelectric thin film 17 such as a $SrBi_2Ta_2O_9$(SBT) is formed on the second Pt layer 16. A third Pt layer as an upper electrode material is then formed on the ferroelectric thin film 17 to the thickness of 1,000 to 2,000 Å and etched to form an upper electrode 18. Referring to FIG. 1E, the ferroelectric thin film 17, the second Pt layer 16 and the titanium oxide layer containing Pt 15 are etched to form a titanium oxide pattern containing Pt 15a, a lower electrode 16a and a ferroelectric thin film pattern 17a, thereby forming a capacitor 100. Next, to recover damages due to the etching process, a thermal process is performed at the temperature of 800° C. for 1 hour under oxygen atmosphere by furnace.

Figure 1F:
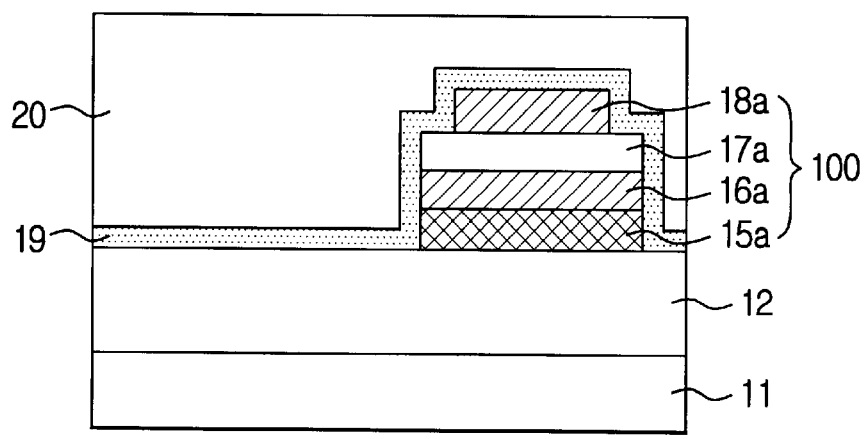

Referring to FIG. 1F, a first diffusion barrier layer 19 is formed on the surface of the structure of FIG. 1E, for preventing Bi from volatiling from the ferroelectric thin film pattern 17a. Next, a second intermediate insulating layer 20 is formed on the first diffusion barrier layer 19. Here, the first diffusion barrier layer 19 is formed to the thickness of 1,000 to 2,000 Å using a titanium oxide layer. The second intermediate insulating layer 20 is formed of a silicon oxide layer.

Figure 1G:
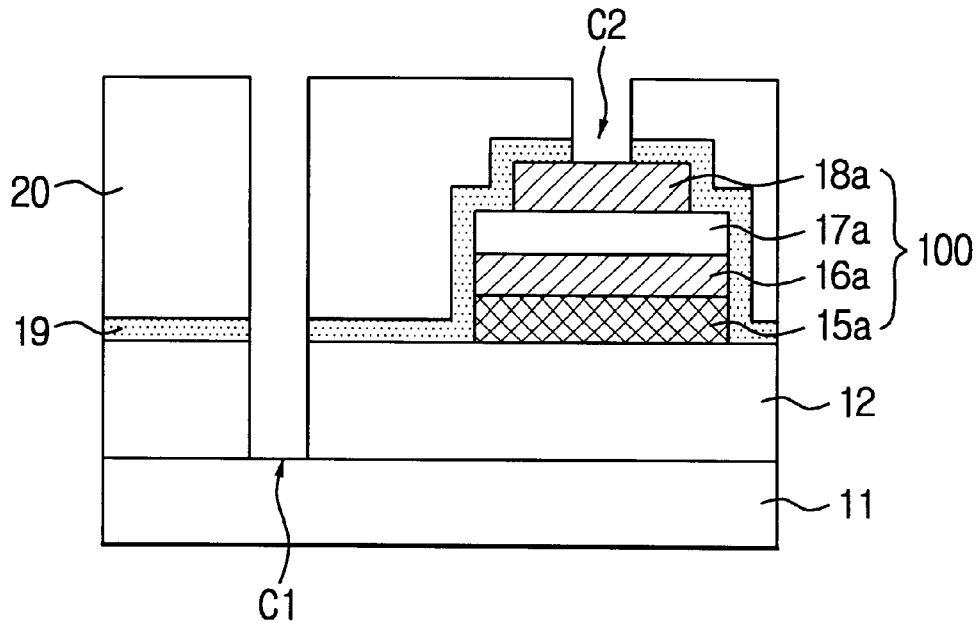

Referring to FIG. 1G, the second intermediate insulating layer 20, the first diffusion barrier layer 19 and the first intermediate insulating layer 12 are etched to form a first contact hole C1 exposing a portion of the substrate 11, and the second intermediate insulating layer 20 and the first diffusion barrier layer 19 are etched to form a second contact hole C2 exposing the upper electrode 18.

Figure 1H:
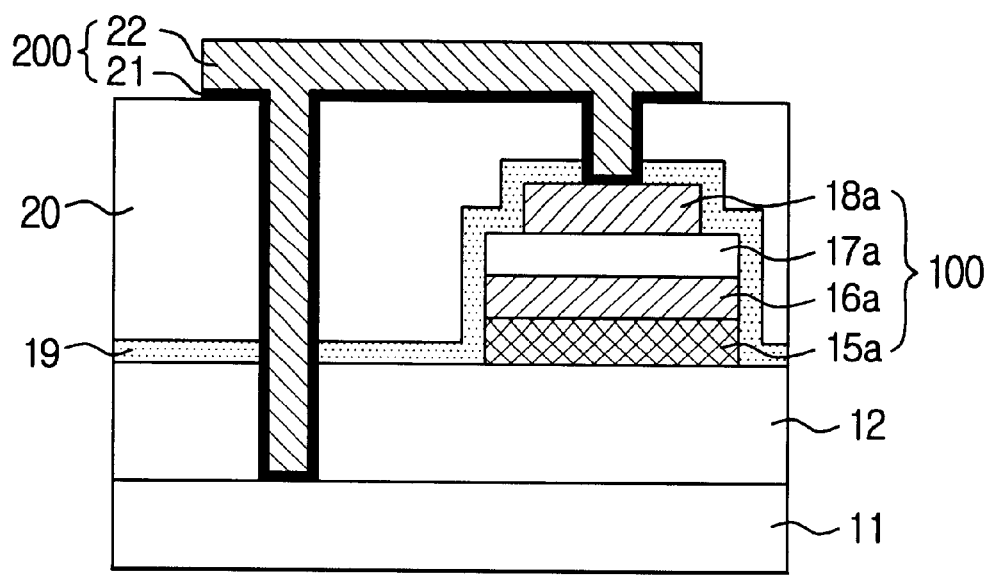

Referring to FIG. 1H, a second diffusion barrier layer 21 is formed on the surfaces of the first and second contact holes C1 and C2 and on the second intermediate insulating layer 20. Preferably, the second diffusion barrier layer 21 is formed of a stacked layer of a titanium layer and a titanium nitride layer. Here, the thickness of the titanium layer is 200 Å and the thickness of the titanium nitride layer is 500 Å. Next, to improve the properties of the second diffusion barrier layer 21, a thermal process is performed at the temperature 450° C. for 30 minutes under nitrogen atmosphere. A metal layer 22 for wiring is formed then on the second barrier diffusion layer 21. The metal layer 22 is formed of a tungsten layer, an aluminum layer or a copper layer. Thereafter, the metal layer 22 and the second diffusion barrier layer 21 are etched to form an interconnection line 200 connecting the substrate 11 with the upper electrode 18 of the capacitor 100.

According to the first embodiment as described above, the Ti layer 13 as the glue layer is transformed into the titanium oxide layer containing Pt 15, so that Ti is prevented from diffusing into the second Pt layer 16 and oxidizing therein when performing thermal processes under oxygen atmosphere subsequently, thereby improving the adhesion and the surface roughness of the lower electrode 16a.

FIG. 2A to FIG. 2G are cross sectional views describing a method of manufacturing a ferroelectric memory device according to a second of the present invention.

Figure 2A:
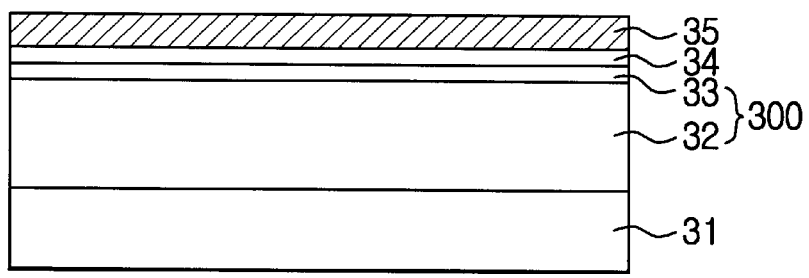
FIG. 2A to FIG. 2G are cross sectional views describing a method of manufacturing a ferroelectric memory device according to a second embodiment of the present invention.

Referring to FIG. 2A, a boron phosphorous silicate glass (BPSG) layer 32 and a medium temperature oxide(MTO) layer 33 as an intermediate insulating layer 300 are formed on a semiconductor substrate 31, in sequence. A Ti layer 34 as a glue layer is then formed on the MTO layer 33 and a first Pt layer 35 is formed thereon by in-situ. Preferably, the Ti layer 34 is formed to the thickness of 50 to 500 Å and the first Pt layer 35 is formed to the thickness of 1,000 to 3,000 Å.

Figure 2B:
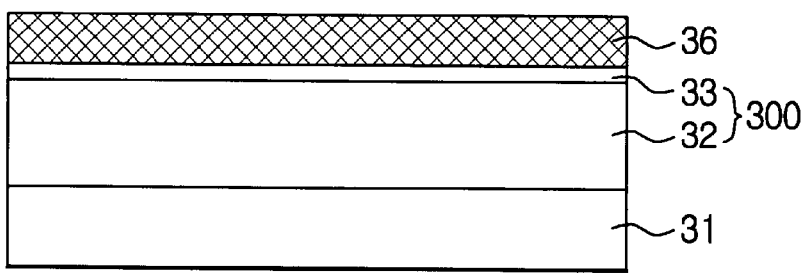

Thereafter, a first thermal process is performed at the temperature of 400 to 600° C. for 10 minutes to 2 hours under the atmosphere of $N_2$ gas or inert gas such as He, Ar, Kr, Xe or Rn by furnace, to react Pt with Ti, thereby forming a platinum titanium($Pt_xTi_y$) alloy layer 36, as shown in FIG. 2B. Sequentially, a second thermal process is performed at the temperature of 600 to 800° C. for 10 minutes and 2 hours under oxygen atmosphere to prevent diffusion of Ti.

Figure 2C:
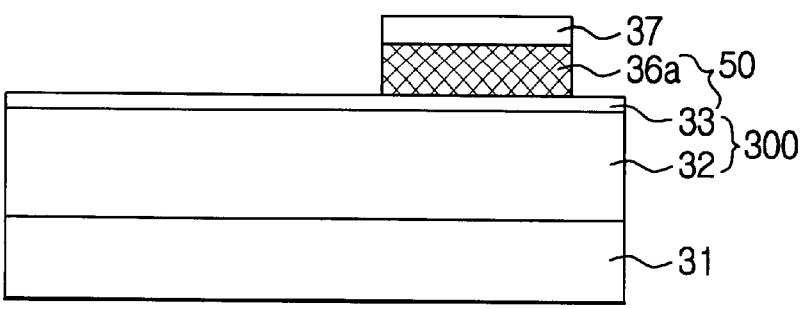
Figure 2D:
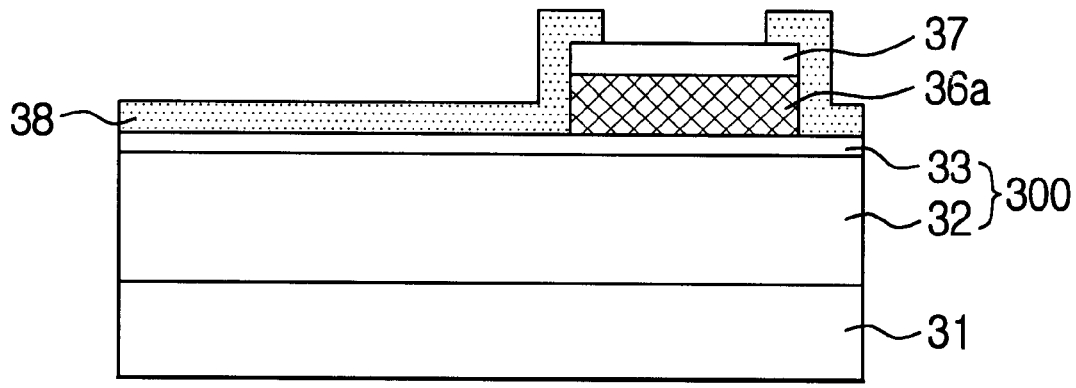

Referring to FIG. 2C, a ferroelectric thin film such as a SBT layer is formed on the $Pt_xTi_y$ alloy layer 36. The ferroelectric thin film and the $Pt_xTi_y$ alloy layer 36 are then etched to form a ferroelectric thin film pattern 37 and a lower electrode 36a. Referring to FIG. 2D, a capping layer 38 formed of a silicon oxide layer is formed on the surface of the structure of FIG. 2C and etched so as to expose the ferroelectric thin film pattern 37.

Figure 2E:
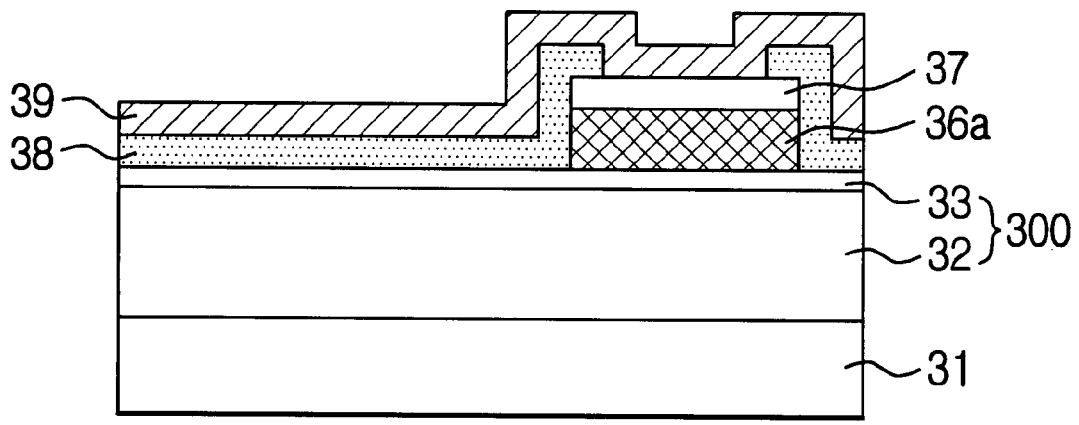

Next to improve the adhesion between the exposed ferroelectric thin film pattern 37 and an upper electrode which will be formed after, a thermal process is performed at the low temperature, preferably, the temperature of 100 to 300° C. for 10 minutes to 2 hours under the vacuum. Sequentially, a second Pt layer 39 as an upper electrode material is formed on the exposed ferroelectric thin film pattern 37 and the capping layer 38 by in-situ, as shown in FIG. 2E.

Figure 2F:
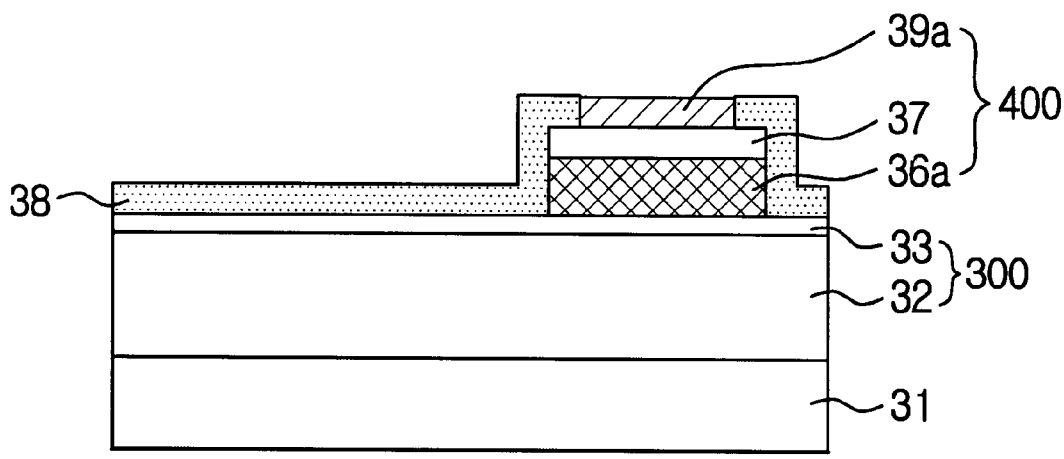
Figure 2G:
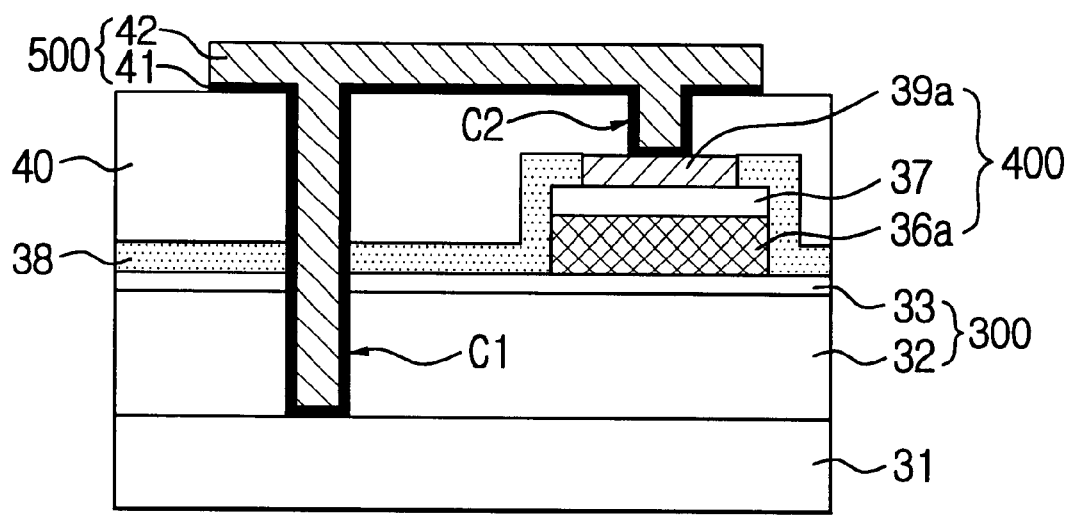

Referring to FIG. 2F, the second Pt layer 39 is etched so as to expose the surface of the capping layer 38 to form an upper electrode 39a, thereby forming a capacitor 400. Referring to FIG. 2G, a second intermediate insulating layer 40 is formed on the structure of FIG. 2F. The second intermediate insulating layer 40, the capping layer 38 and the first intermediate insulating layer 300 are then etched to form a first contact hole C1 exposing a portion of the substrate 31, and the second intermediate insulating layer 40 is etched to form a second contact hole C2 exposing the upper electrode 39a. Thereafter, a diffusion barrier layer 41 is formed on the surfaces of the first and second contact holes C1 and C2 and on the second intermediate insulating layer 40, and a metal layer 42 for wiring is formed thereon. The metal layer 42 is formed of a tungsten layer, an aluminum layer or a copper layer. Next the metal layer 42 and the second diffusion barrier layer 41 are etched to form an interconnection line 500 connecting the substrate 31 with the upper electrode 39a of the capacitor 400.

According to the second embodiment described above, after forming the first Pt layer 35 of the lower electrode material, a thermal process is performed under the atmosphere of $N_2$ gas or inert gas, instead of crystallizing the first Pt layer 35 under oxygen atmosphere. Therefore, Ti is prevented from oxidizing when performing thermal processes under oxygen atmosphere subsequently, thereby improving the adhesion and the surface roughness of the lower electrode 36a. Furthermore, the second Pt layer 39 is formed by in-situ after thermal-treating the ferroelectric thin film pattern at the low temperature, thereby improving the adhesion between the ferroelectric thin film pattern 37 and the upper electrode 39a.

According to the present invention, Ti is prevented from oxidizing in a Pt layer of a lower electrode material when performing thermal processes under oxygen atmosphere subsequently, thereby improving the adhesion and the surface roughness of the lower electrode.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of manufacturing a ferroelectric memory device, comprising the steps of:
    forming on a semiconductor substrate in sequence, a first intermediate insulating layer, a titanium layer and a first platinum layer, the total thickness of the titanium and the first platinum layers being between 100–300 Å;
    treating by a rapid thermal process the substrate and sequential layers tinder an oxygen atmosphere at a temperature between 600–800° C. for about one minute causing said titanium (Ti) layer and said first platinum (Pt) layer to interdiffuse while simultaneously oxidizing the titanium (Ti), thereby forming a titanium oxide layer containing platinum (Pt);
    forming a second platinum layer for a lower electrode, a ferroelectric thin flim and a third platinum layer for an upper electrode on the titanium oxide layer continuing platinum;
    etching the third platinum layer to form the upper electrode; and
    etching the ferroelectric thin film, the second platinum layer and the titanium oxide layer containing platinum to form a capacitor.

2. The method according to claim 1, wherein said first platinum layer has a thickness approximately one-quarter of the thickness of the titanium layer.

3. The method according to claim 1, further comprising the steps of:
    forming a first diffusion barrier layer on the overall substrate;
    forming a second intermediate insulating layer on the first diffusion barrier layer;
    etching the second intermediate insulating layer, the first diffusing barrier layer and the first intermediate insulating layer to form a first contact hole exposing a portion of the substrate, and etching the second intermediate insulating layer and the first diffusion barrier layer to form a second contact hole exposing the upper electrode;
    forming a second diffusion barrier layer and a metal layer for wiring on the surfaces of the first and second contact holes and on the second intermediate insulating layer, sequentially; and
    etching the metal layer and the second diffusion barrier layer to form an interconnection line connecting the substrate with the upper electrode of the capacitor.

4. The method according to claim 3, wherein the first diffusion barrier layer is formed of a titanium oxide layer.

5. The method according to claim 3, wherein the second diffusion barrier layer is formed of a stacked layer of a titanium layer and a titanium nitride layer.

6. A method of manufacturing a ferroelectric memory device, comprising the steps of:
    forming on a semiconductor substrate, in sequence, a first intermediate insulating layer, a titanium layer and a first platinum layer, the first titanium layer being formed to a thickness of between 1000 to 3000 Å;
    treating by a first thermal treatment process the substrate under the atmosphere of $N_2$ gas or inert gas at a temperature of between 400–600° C. for a period of from 10 to 120 minutes to react the titanium layer with the first platinum layer, thereby forming a platinum titanium ($Pt_xTi_y$) alloy layer;
    treating by a second thermal treatment process the substrate under oxygen atmosphere, at a temperature of between 600–800° C. for a period of from 10 to 120 minutes, to prevent titanium not reacted during the first thermal process from diffusing;
    forming a ferroelectric thin film on the platinum titanium alloy layer;
    etching the ferroelectric thin film and the platinum titanium alloy layer to form a ferroelectric thin film pattern and a lower electrode;
    forming a capping layer on the overall substrate so as to expose the ferroelectric thin film pattern; and
    forming an upper electrode on the exposed ferroelectric thin film pattern, thereby forming the capacitor.

7. The method according to claim 6, wherein the first platinum layer is formed by in-situ after forming the titanium layer.

8. The method according to claim 6, wherein the titanium layer is formed to the thickness of 50 to 500 Å.

9. The method according to claim 6, wherein the capping layer is formed of a silicon oxide layer.

10. The method according to claim 6, further comprising the step of thermal-treating between the step of forming the capping layer and the step of forming the upper electrode.

11. The method according to claim 10, wherein the thermal-treating is performed at the temperature of 100 to 300° C. for 10 minutes to 2 hours under the vacuum.

12. The method according to claim 11, wherein the upper electrode is formed by in-situ after thermal-treating the upper electrode.

13. The method according to claim 6, further comprising the steps of: forming a second intermediate insulating layer on the overall substrate;
    etching the second intermediate insulating layer, the capping layer and the first intermediate insulating layer to form a first contact hole exposing a portion of the substrate, and etching the second intermediate insulating layer to form a second contact hole exposing the upper electrode;
    forming a diffusion barrier layer and a metal layer for wiring on the surfaces of the contact holes and on the second intermediate insulating layer; and
    etching the metal layer and the diffusion barrier layer to form an interconnection line connecting the substrate with the upper electrode of the capacitor.

* * * * *